(12) United States Patent
Heine et al.

(10) Patent No.: US 7,674,038 B2
(45) Date of Patent: Mar. 9, 2010

(54) ARRANGEMENT FOR TEMPERATURE MONITORING AND REGULATION

(75) Inventors: Frank Heine, Mainhardt (DE); Lars Bartelt-Berger, Backnang (DE); Berry Smutny, Backnang (DE)

(73) Assignee: Tesat-Spacecom GmbH & Co. KG, Backnang (DE)

( * ) Notice: Subject to any disclaimer, the term of this patent is extended or adjusted under 35 U.S.C. 154(b) by 0 days.

(21) Appl. No.: 10/220,387

(22) PCT Filed: Oct. 24, 2001

(86) PCT No.: PCT/DE01/04043

§ 371 (c)(1),
(2), (4) Date: Dec. 23, 2002

(87) PCT Pub. No.: WO02/054166

PCT Pub. Date: Jul. 11, 2002

(65) Prior Publication Data

US 2003/0152130 A1    Aug. 14, 2003

(30) Foreign Application Priority Data

Dec. 29, 2000    (DE)    ................ 100 65 723

(51) Int. Cl.
| G01K 7/16 | (2006.01) |
| G01K 1/16 | (2006.01) |
| H05B 3/06 | (2006.01) |
| H05B 3/20 | (2006.01) |

(52) U.S. Cl. .................. 374/141; 374/185; 374/117; 374/1; 338/13; 219/200; 219/542

(58) Field of Classification Search ............ 374/1, 374/208, 164, 163, 183–185, 100, 103, 29–39, 374/117–119, 135; 338/22 R, 28, 308, 5, 338/7–10, 279–280, 283, 287; 219/539, 219/542, 548, 552, 201, 200, 546–547, 536, 219/535

See application file for complete search history.

(56) References Cited

U.S. PATENT DOCUMENTS

| 4,284,872 A | * | 8/1981 | Graeme ............... 219/121.69 |
| 4,286,377 A | * | 9/1981 | Hurko et al. ............ 29/612 |
| 4,719,384 A | * | 1/1988 | Hauden et al. .......... 310/343 |
| 4,794,323 A | * | 12/1988 | Zhou et al. ............. 324/71.5 |

(Continued)

FOREIGN PATENT DOCUMENTS

EP    0 036 042    9/1981

(Continued)

OTHER PUBLICATIONS

IEC 751 Industrial platinum resistance thermometer sensors, First Edition (1983).

(Continued)

*Primary Examiner*—Gail Verbitsky
(74) *Attorney, Agent, or Firm*—Kenyon & Kenyon LLP

(57) ABSTRACT

To measure and regulate temperature, a temperature measuring resistor and a control element are accommodated in one layer as metallization on a substrate. The printed or otherwise manufactured conductors of the temperature measuring resistor and of the control element are arranged in close proximity to one another.

5 Claims, 1 Drawing Sheet

U.S. PATENT DOCUMENTS

| | | | | |
|---|---|---|---|---|
| 4,859,835 | A * | 8/1989 | Balderson | 219/543 |
| 4,882,466 | A * | 11/1989 | Friel | 219/219 |
| 4,884,443 | A * | 12/1989 | Lee et al. | 73/204.16 |
| 4,987,579 | A * | 1/1991 | Yoshinaka et al. | 377/25 |
| 5,041,800 | A * | 8/1991 | Long et al. | 331/69 |
| 5,108,193 | A * | 4/1992 | Furubayashi | 374/164 |
| 5,134,248 | A * | 7/1992 | Kiec et al. | 174/84 R |
| 5,142,266 | A * | 8/1992 | Friese et al. | 338/22 R |
| 5,202,665 | A * | 4/1993 | Hafele | 338/25 |
| 5,267,252 | A * | 11/1993 | Amano | 372/34 |
| 5,289,075 | A * | 2/1994 | Besson et al. | 310/367 |
| 5,430,428 | A * | 7/1995 | Gerblinger et al. | 338/25 |
| 5,488,350 | A * | 1/1996 | Aslam et al. | 338/225 D |
| 5,491,604 | A * | 2/1996 | Nguyen et al. | 361/278 |
| 5,708,205 | A * | 1/1998 | Yamada et al. | 73/204.26 |
| 5,813,764 | A * | 9/1998 | Visser et al. | 374/12 |
| 6,072,165 | A * | 6/2000 | Feldman | 219/543 |
| 6,077,228 | A * | 6/2000 | Schonberger | 600/549 |
| 6,152,597 | A * | 11/2000 | Potega | 374/185 |
| 6,169,321 | B1 | 1/2001 | Nguyen et al. | 257/536 |
| 6,208,213 | B1 * | 3/2001 | Anastasyev et al. | 331/69 |
| 6,242,314 | B1 | 6/2001 | Chen et al. | 438/384 |
| 6,259,350 | B1 * | 7/2001 | Mueller-Fiedler et al. | 338/25 |
| 6,353,381 | B1 * | 3/2002 | Dietmann et al. | 338/25 |
| 6,354,736 | B1 * | 3/2002 | Cole et al. | 374/185 |
| 6,371,925 | B1 * | 4/2002 | Imai et al. | 600/549 |
| 6,418,784 | B1 * | 7/2002 | Samman et al. | 73/31.06 |
| 6,437,681 | B1 * | 8/2002 | Wang et al. | 338/25 |
| 6,455,823 | B1 * | 9/2002 | Bulgajewski et al. | 219/548 |
| 6,470,742 | B1 * | 10/2002 | Yamakawa et al. | 73/204.26 |
| 6,477,479 | B1 * | 11/2002 | Mansky et al. | 702/136 |
| 6,495,809 | B2 * | 12/2002 | Bulgajewski et al. | 219/548 |
| 6,508,117 | B1 * | 1/2003 | DuBois et al. | 73/204.26 |
| 6,554,609 | B2 * | 4/2003 | Yadav et al. | 432/9 |
| 6,699,748 | B2 * | 3/2004 | Toyoshima et al. | 438/240 |
| 6,764,297 | B2 * | 7/2004 | Godwin et al. | 425/549 |
| 6,863,438 | B2 * | 3/2005 | Pannek et al. | 374/121 |
| 7,059,769 | B1 * | 6/2006 | Potega | 374/185 |
| 7,249,409 | B2 * | 7/2007 | Landsberger et al. | 29/610.1 |
| 7,378,781 | B2 * | 5/2008 | Vilander | 310/343 |
| 2002/0117495 | A1 * | 8/2002 | Kochman et al. | 219/549 |
| 2003/0062984 | A1 * | 4/2003 | Ito et al. | 338/25 |
| 2003/0121140 | A1 * | 7/2003 | Arx et al. | 29/611 |
| 2003/0183620 | A1 * | 10/2003 | Wong | 219/549 |
| 2003/0185270 | A1 * | 10/2003 | Kawai et al. | 374/40 |
| 2004/0112663 | A1 * | 6/2004 | Kocher et al. | 180/274 |
| 2006/0034346 | A1 * | 2/2006 | Saio et al. | 374/185 |

FOREIGN PATENT DOCUMENTS

| | | |
|---|---|---|
| EP | 0 094 266 | 11/1983 |
| EP | 0217713 A1 * | 9/1986 |
| EP | 0 465 914 | 1/1992 |
| EP | 1598931 A1 * | 11/2005 |
| FR | 2685579 A1 * | 6/1993 |
| GB | 2376532 A * | 12/2002 |
| JP | 58 217 022 | 12/1983 |
| JP | 63236935 A * | 10/1988 |
| JP | 1208805 A * | 8/1989 |
| JP | 07201511 A * | 8/1995 |
| JP | 08079002 A * | 3/1996 |
| JP | 2000101346 A * | 4/2000 |
| RU | 2101854 C1 * | 1/1998 |

OTHER PUBLICATIONS

IEC 751 Industrial platinum resistance thermometer sensors, Amendment 1 (1986).

IEC 751 Industrial platinum resistance thermometer sensors, Amendment 2 (1995).

* cited by examiner

Section A-A

Section B-B

ARRANGEMENT FOR TEMPERATURE MONITORING AND REGULATION

FIELD OF THE INVENTION

The present invention is directed to a system for measuring and regulating temperature, having a temperature measuring resistor and a control element.

BACKGROUND INFORMATION

For highly accurate temperature measurement that is stable over a long period of time, metal film resistors, in particular platinum film resistors, have been used due to the relatively strong temperature-dependence of the electric resistivity of platinum and its high chemical and physical resistance. The properties of platinum resistors for use in industrial temperature measurement are described in DIN IEC 751.

A common manufacturing method which is also used in large-scale industrial production is the vapor deposition of a metal layer, e.g., platinum, on ceramic substrates, which allows accurate control of the layer thickness and thus of the resistance for a given structure. The surface of this thin film can be subsequently shaped as desired by masking and etching. In order to obtain an absolute calibration and highly accurate resistance, the resistor structure must be trimmed. This trimming is performed using laser ablation, for example.

The above-described methods provide highly accurate temperature measuring resistors that are stable over a long period of time. The smallest surface resistor shapes and structures can be realized using manufacturing processes similar to those in the semiconductor industry. Using this manufacturing method, the shape of the metal film resistor on the surface of the substrate is relatively freely selectable. In order to arrive at the smallest possible shapes for a given desired resistance, and to enable the use of simple trimming algorithms, the resistors are usually given a wave-shaped structure.

Electrical contacting of the thin-film resistors is effected via contact wires soldered, bonded, or welded to the contact surfaces.

For temperature regulation, the combination of a temperature measuring resistor with a control element is needed. This control element may be a Peltier element or, for an application requiring long-term stability, a resistance heating element, for example.

SUMMARY OF THE INVENTION

The present invention allows highly stable and highly accurate temperature regulation of preferably planar components. Because the temperature measuring resistor is adjacent to the control element on a common substrate with the respective printed or otherwise manufactured conductors in close proximity, the temperature difference between the temperature measuring resistor and the control element is minimized. This allows maximum absolute accuracy to be achieved in measuring the temperature of the control element.

Furthermore, the cost of implementing a temperature regulating system is reduced because of the smaller number of components due to the integration of the control element and the temperature measuring resistor on a common planar substrate. This is important in particular for an automated planar hybrid assembly.

The control element and the temperature measuring resistor are produced in a common manufacturing process, which results in reduced costs in addition to technical advantages.

Conventional production methods for metal thin-film resistors may be used for manufacturing the proposed system.

The essence of the present invention is the combination of two metal film resistors adjacent to one another on a preferably planar substrate. The function of the control element is assigned to one of the metal film resistors, while the second metal film resistor is used as a temperature measuring resistor.

The advantages of the above-described combination of metal film resistors are:

the minimized physical distance between control element and temperature measuring resistor minimizes the temperature difference between the two metal film resistors. Maximum accuracy in measuring the absolute temperature of the control element is thus achieved;

the time between a change in temperature of the control element and of the temperature measuring resistor is minimized due to the minimized physical distance. This increases the stability of electronic regulation which uses one of the metal film resistors as the control element and the other one as the temperature measuring resistor (minimal delay);

the integration of two functions in a single component reduces the space requirement for control element and temperature measuring resistor (temperature sensor of a temperature regulating system). This may be the only possible implementation of a highly stable temperature regulation for very small components having edge lengths of a few millimeters;

the integration of two functions using the same technology on a single substrate reduces the manufacturing complexity and thus the costs;

the absence of a joint between the control element and the temperature measuring resistor increases the long-term stability of the temperature measurement and temperature regulation. This is very important in particular under extreme environmental conditions (wide temperature ranges, vacuum, radiation irradiation, aggressive chemicals);

the combination of a control element and a temperature measuring resistor designed as a planar component is compatible with the planar hybrid assembly method, which allows easy integration of such a component using automated manufacturing methods.

Due to the system according to the present invention, the printed or otherwise manufactured conductors of the temperature measuring resistor and the control element are subjected to exactly the same temperature variation, which contributes to accurate temperature measurement and regulation.

The present invention results in a negligible temperature gradient between a mounted component (e.g., a laser resonator or electrical resonator) and temperature measuring resistor, and there is minimum delay time between a temperature change of the control element/mounted component and a measurement/detection of the changed temperature, which might result in reduced regulating system stability.

The present invention allows the control element to be designed as the temperature measuring resistor with the only difference that it is heated by the application of a heating current.

According to the present invention, the temperature measuring resistor and the control element may be manufactured in a single operation by vapor deposition, printing or screen printing.

By applying an insulating protective film (e.g., glass) on the two printed or otherwise manufactured conductors according to the present invention, greater freedom is obtained in joining the control element/temperature measuring resistor combination to a component whose temperature is to be measured and regulated.

The present invention makes a simple calibration method available, in particular in order to achieve characteristic values of the temperature measuring resistor that conform to the standards.

The present invention points out an advantageous possible application of the system according to the present invention for resonators.

DETAILED DESCRIPTION

Figure 1:
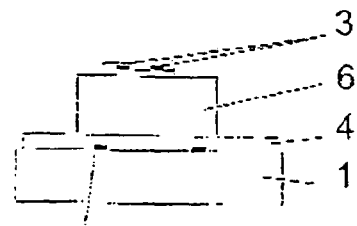
FIG. 1 shows a conventional system for temperature regulation.

Before describing the actual system according to the present invention, we shall describe a conventional system for temperature measurement and temperature regulation. FIG. 1 shows such a conventional system. The temperature of a component 6 is to be measured and regulated. A temperature sensor 3 is provided on the top of side of component 6. The bottom of component 6 is provided with a control element 2 in the form of a heating resistor, which was applied to a substrate 1 and is covered with an insulating layer 4.

The physical distance between control element 2 and temperature sensor 3 results in a temperature gradient between sensor and control element and therefore in a corresponding inaccuracy in the temperature measurement. In addition, the physical distance results in a delay between manipulated variable and actual value, which causes reduced stability of the regulating system.

Figure 2:
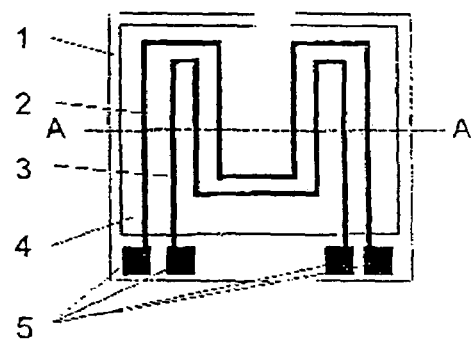
FIG. 2 shows a plan view of a system according to the present invention.

FIG. 2 illustrates an exemplary embodiment of a system according to the present invention. Temperature measuring resistor 3 and control element 2 are applied to a substrate 1 in a common layer as a metal plating. An aluminum oxide substrate is suitable as a substrate. Strip-like printed conductors of temperature measuring resistor 3 and control element 2 are situated adjacent to one another and run essentially in parallel to one another in a wave-shaped pattern. Control element 2 preferably has a metal resistor layer made of the same material as the metal resistor layer of the temperature measuring resistor. The only differences between the control element and the temperature measuring resistor are that an electric voltage is applied to the resistor layer of control element 2 to heat it. Different resistances are used depending on the desired control characteristic, for example, 10 to 100Ω for control element 2 and 1000Ω for temperature measuring resistor 3.

The two resistor layers are applied to substrate 1 using known methods, e.g., by vapor deposition. The resistor layers of temperature measuring resistor 3 and control element 2 are electrically contacted via contacts 5, which may be designed as solderable, bondable, or weldable contacts. Passivating protective layer 4 may be applied to metal resistor layers 2 and 3 for protection. This layer allows greater freedom in joining the heating element/temperature sensor combination to a component 6 whose temperature is to be measured and regulated (see sectional view in FIG. 5).

An electric voltage is applied to the contacts of control element 2 (heating resistor). The current and the voltage across the heating resistor produces a heating power with which component 6 and substrate 1 are warmed. The temperature in the plane of the substrate surface is measured using the temperature measuring resistor. A definite resistance is established as a function of the resistor temperature (for platinum metal film resistors see DIN IEC 751). The resistance is measurable with high accuracy using a bridge circuit.

The shape and position of metal resistors 2 and 3 are virtually freely selectable within the plane, because the resistors may be manufactured using the above-mentioned vapor deposition, printing, and or screen printing technology. Only the respective masks are produced, and no overlap occurs between the printed conductors of control element 2 and temperature measuring resistor 3.

This degree of freedom in design makes it possible to adjust the shape of the resistors to the geometry of a given component 6 to be measured and regulated in temperature. The adaptation of the heating resistor geometry to the component may be used for homogeneous heating of the component. The measuring resistor geometry may be thus adapted to make possible the measurement of the average temperature of component 6.

In order to achieve characteristic values of the measuring resistor that conform to the standards, it is also possible to apply adjusting structures on the substrate. These adjusting structures may be located inside or outside the base surface of component 6 on substrate 1.

Due to the configuration of the heating resistor and measuring resistor in one plane, the temperature of this plane can be measured with high accuracy. To ensure that the temperature of component 6 exactly corresponds to that of the measuring plane, the component is thermally insulated from the rest of the environment.

Figure 3:
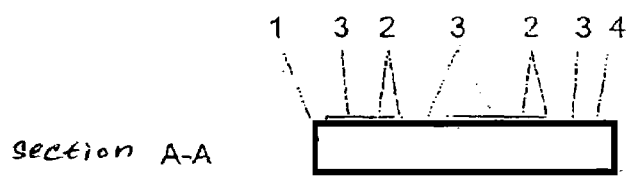
FIG. 3 shows a section through the system according to FIG. 2.
Figure 4:
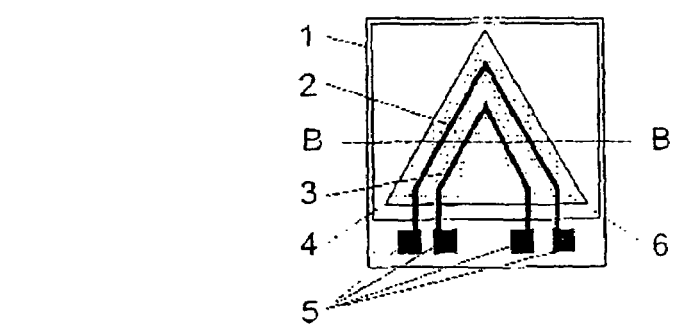
FIG. 4 shows a plan view of a modified system according to the present invention.
Figure 5:
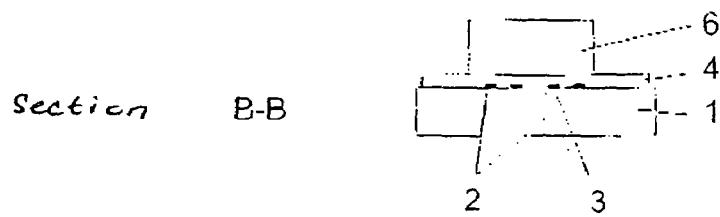
FIG. 5 shows a section through the system according to FIG. 4.

While the arrangement illustrated in FIGS. 2 and 3 has a wave-shaped pattern of the printed or otherwise manufactured conductors of temperature measuring resistor 3 and control element 2, the arrangement of the printed conductors of temperature measuring resistor 3 and control element 2 in FIGS. 4 and 5 is triangular, because component 6 directly mounted on the layer of the printed conductors of temperature measuring resistor 3 and control element 2, i.e., on layer 4 which covers them, also has a triangle-shaped design.

The components 6 whose temperature is to be measured and regulated may include components requiring high-precision temperature regulation, such as, for example, optical (laser crystals) or electrical (quartz) resonators. The intrinsic frequency of such resonators depends on their geometric dimensions and their thermal expansion, and thus on their temperature. Therefore, with the control of the absolute temperature of these components, a high-precision absolute frequency stabilization is achieved.

What is claimed is:

1. A method of using a system for measuring and regulating temperature, the system including a substrate, a temperature measuring resistor including conductors, and a control element including conductors, the temperature measuring resistor and the control element being applied to the substrate to be in a single layer, and the conductors of the temperature measuring resistor and the conductors of the control element running next to one another in a side by side manner, along a substantial entirety of the lengths of the conductors of the temperature measuring resistor and the control element, the method comprising:

placing the system proximate to one of an optical resonator and an electrical resonator to utilize the system to perform a temperature regulation of the one of the optical resonator and the electrical resonator.

2. The method as recited in claim 1, wherein:
the single layer is applied as a metal plating.

3. A system for measuring and regulating temperature, comprising:

a substrate;
a temperature measuring resistor including conductors;
a control element including conductors, the temperature measuring resistor and the control element being applied to the substrate to be in a single layer, wherein the conductors of the temperature measuring resistor and the conductors of the control element run next to one another in a side by side manner, along a substantial entirety of the lengths of the conductors of the temperature measuring resistor and the control element;
an insulating layer covering the conductors of the temperature measuring resistor and the conductors of the control element; and
a component, whose temperature is to be measured and regulated, directly mounted on the insulating layer at a side of the insulating layer facing away from the substrate, wherein the component includes one of an optical resonator and an electrical resonator.

4. A system for measuring temperature and regulating temperature based on the measurements, comprising:

a substrate;
a temperature measuring resistor including conductors; and
a control element resistor including conductors, the temperature measuring resistor and the control element resistor being applied to the substrate to be in a single layer, wherein:

the conductors of the temperature measuring resistor and the conductors of the control element resistor run next to one another in a side by side manner, along a substantial entirety of the lengths of the conductors of the temperature measuring resistor and the control element resistor, the temperature measuring resistor is configured to output a measurement of a temperature of the control element resistor, the system is configured to regulate the temperature of the control element resistor based on the measurement, the temperature measuring resistor and the control element resistor differ from each other only (a) in their respective positions on the substrate, (b) in that at least one of a current and a voltage is selectively applied to the control element resistor without application to the temperature measuring resistor, and (c) in that different resistances are used for the temperature measuring resistor and the control element resistor, a material of the temperature measuring resistor and a material of the control element resistor being the same.

5. The system as recited in claim 4, wherein a resistance of 10 to 100Ω is used for the control element and a resistance of 1000Ω is used for the temperature measuring resistor.

* * * * *